US012658262B2

(12) United States Patent
Sforzin et al.

(10) Patent No.: US 12,658,262 B2
(45) Date of Patent: Jun. 16, 2026

(54) DRIFT COMPENSATION FOR CODEWORDS IN MEMORY

(71) Applicant: Micron Technology, Inc., Boise, ID (US)

(72) Inventors: Marco Sforzin, Cernusco sul Naviglio (IT); Paolo Amato, Treviglio (IT); Luca Barletta, Gallarate (IT); Marco Pietro Ferrari, Milan (IT); Antonino Favano, Brolo (IT)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 18/759,032

(22) Filed: Jun. 28, 2024

(65) Prior Publication Data

US 2024/0355395 A1     Oct. 24, 2024

Related U.S. Application Data

(63) Continuation of application No. 17/948,556, filed on Sep. 20, 2022, now Pat. No. 12,027,212.

(Continued)

(51) Int. Cl.
*G11C 16/10*     (2006.01)
*G11C 16/12*     (2006.01)
*G11C 16/34*     (2006.01)

(52) U.S. Cl.
CPC ............ *G11C 16/102* (2013.01); *G11C 16/12* (2013.01); *G11C 16/3404* (2013.01)

(58) Field of Classification Search
CPC ... G11C 16/102; G11C 16/12; G11C 16/3404; G11C 29/021; G11C 29/028;

(Continued)

(56) References Cited

U.S. PATENT DOCUMENTS 10,431,301 B2     10/2019   Mirichigni et al.
10,566,052 B2     2/2020    Mirichigni et al.

(Continued)

OTHER PUBLICATIONS

Schouhamer Immink, et al., "Minimum Pearson Distance Detection for Multilevel Channels With Gain and/or Offset Mismatch", IEEE Transactions on Information Theory, issue 10, vol. 60, Oct. 2014, pp. 5966-5974.

(Continued)

*Primary Examiner* — Xiaochun L Chen
(74) *Attorney, Agent, or Firm* — Brooks, Cameron & Huebsch, PLLC

(57)          ABSTRACT

The present disclosure includes apparatuses, methods, and systems for drift compensation for codewords in memory. An embodiment includes a memory device having an array of memory cells, and circuitry to sense a codeword stored in the array, determine a threshold voltage value of each cell of the codeword, sort the threshold voltage values, determine a second derivative value of a cell metric for a number of the cells of the codeword based on the threshold voltage value of that respective cell, the threshold voltage value immediately preceding the threshold voltage value of that respective cell in the sorted values, and a value proportional to a total quantity of the cells of the codeword, determine the cell metric for which the determined second derivative value has a greatest value, input the determined cell metric to a Pearson detector, and determine originally programmed data of the codeword using the Pearson detector.

20 Claims, 4 Drawing Sheets

Related U.S. Application Data

(60) Provisional application No. 63/402,334, filed on Aug. 30, 2022.

(58) Field of Classification Search
CPC . G11C 16/26; G11C 16/3486; G11C 16/3495; G11C 29/52
See application file for complete search history.

(56) References Cited

U.S. PATENT DOCUMENTS

| | | | |
|---|---|---|---|
| 10,714,185 B2 | 7/2020 | Sforzin et al. | |
| 10,976,936 B2 | 4/2021 | Sforzin et al. | |
| 11,164,619 B2 | 11/2021 | Sforzin et al. | |
| 2023/0027191 A1 * | 1/2023 | Zhang | G06F 11/1048 |
| 2023/0036490 A1 | 2/2023 | Wang | |

OTHER PUBLICATIONS

Schouhamer Immink, et al., "Dynamic Threshold Detection Based on Pearson Distance Detection", IEEE Transactions on Communications, issue 7, vol. 66, Jul. 2018, pp. 2958-2965.

Bu Renfei, et al., "Minimum Pearson Distance Detection Using a Difference Operator in the Presence of Unknown Varying Offset", IEEE Communications Letters, IEEE Service Center, Piscataway, NJ, USA, vol. 23, No. 7, Jul. 1, 2019, 4 pages.

Schouhamer Immink Kees, et al., "Minimum Pearson Distance Detection Using Mass-Centered Codewords in the Presence of Unknown Varying Offset", IEEE Journal on Selected Areas in Communications, IEEE Service Center, Piscataway, NJ, USA, vol. 34, No. 9, Sep. 1, 2016, 8 pages.

* cited by examiner

$\sigma Z_k$ $Y_k$

DRIFT COMPENSATION FOR CODEWORDS IN MEMORY

PRIORITY INFORMATION

This application is a Continuation of U.S. application Ser. No. 17/948,556 filed on Sep. 20, 2022, which claims the benefit of U.S. Provisional Application No. 63/402,334 filed on Aug. 30, 2022, the contents of which are incorporated herein by reference.

TECHNICAL FIELD

The present disclosure relates generally to semiconductor memory and methods, and more particularly, to drift compensation for codewords in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor) or can store data based on their conductivity state. Such memory cells can be programmed to store data corresponding to a target data state by varying the charge level of the storage element (e.g., different levels of charge of the capacitor may represent different data sates) or by varying the conductivity level of the storage element. For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs).

MLCs can provide higher density memories without increasing the number of memory cells since each cell can represent more than one digit (e.g., more than one bit).

BRIEF DESCRIPTION OF THE DRAWINGS

FIGS. 1A and 1B illustrate diagrams of a number of threshold voltage distributions, sensing voltages, and data assignments associated with a group of memory cells in accordance with an embodiment of the present disclosure.

DETAILED DESCRIPTION

Figure 2:
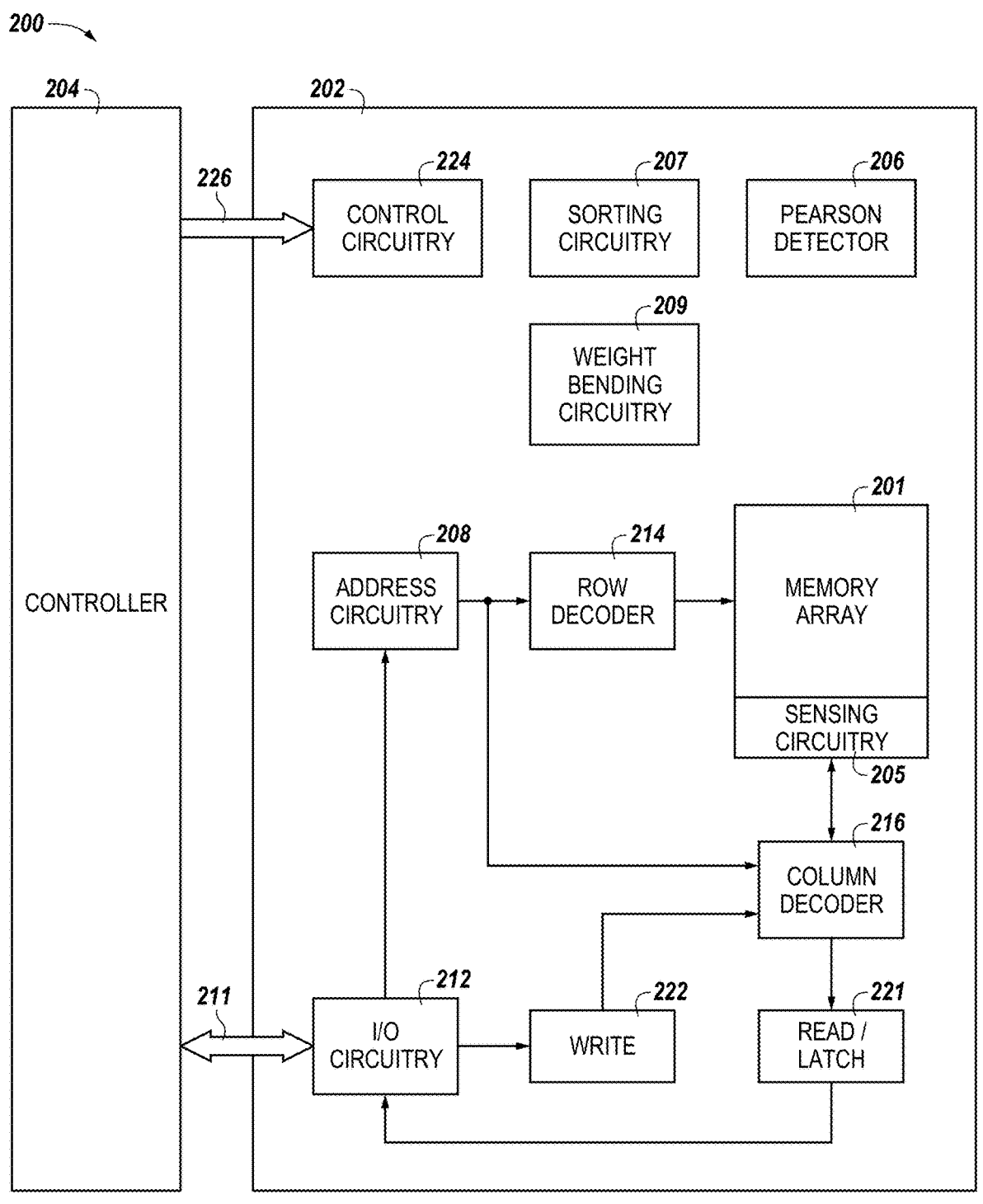
FIG. 2 is a block diagram illustration of an example apparatus in accordance with an embodiment of the present disclosure.

The present disclosure includes apparatuses, methods, and systems for drift compensation for codewords in memory. An embodiment includes a memory device having an array of memory cells, and circuitry to sense a codeword stored in the array, determine a threshold voltage value of each cell of the codeword, sort the threshold voltage values, determine a second derivative value of a cell metric for a number of the cells of the codeword based on the threshold voltage value of that respective cell, the threshold voltage value immediately preceding the threshold voltage value of that respective cell in the sorted values, and a value proportional to a total quantity of the cells of the codeword, determine the cell metric for which the determined second derivative value has a greatest value, input the determined cell metric to a Pearson detector, and determine originally programmed data of the codeword using the Pearson detector.

A memory device can address memory cells for operations (e.g., sense and program operations) in groups (e.g., packets) called words or codewords. As memory cells are sensed and programmed, their response to positive or negative electrical pulses can change cycle after cycle (e.g., according to a specific electrical bias history of the code/word to which they belong).

For example, when performing a sense operation (e.g., a read operation), a memory device may access a memory cell, which may output a signal to sense circuitry that can correspond to the data state of the memory cell (e.g., to a value stored by the memory cell). To determine the data state of the memory cell, the sense circuitry may compare the signal output by the memory cell to a reference signal, which may be, for instance, a reference voltage. The reference voltage may correspond to a voltage positioned between an expected voltage level of the signal output by a memory cell programmed to a first data state (e.g., storing a first logic value) and an expected voltage level of the signal output by a memory cell programmed to a second data state (e.g., storing a second logic value). For instance, the sense circuitry may determine that the memory cell has been programmed to a first data state if the signal output by the memory cell is less than the reference voltage, and that the memory cell has been programmed to a second data state if the signal output by the memory cell is greater than the reference voltage.

If, however, the memory cell experiences threshold voltage drift, the threshold voltage of the memory cell may change such that the signal output by the memory cell during a sense operation does not correspond to the data state to which the memory cell was programmed (e.g., is no longer the expected value of a signal output by a memory cell programmed to that data state). As used herein, "drift" refers to a difference between the programmed threshold voltage of a memory cell and the sensed threshold voltage of the memory cell. Threshold voltage drift can occur in a memory cell after multiple operations (e.g., multiple read cycles) are performed on the memory cell and/or due to temperature variations in the memory cell, for example. Threshold voltage drift can lead to an incorrect read in a memory cell. For instance, threshold voltage drift may result in the memory cells of a codeword being sensed to be in states to which they were not actually programmed (e.g., a cell programmed to be in the first data state may be erroneously sensed to be in the second data state, and/or vice versa). Such erroneous data sensing can reduce the performance and/or lifetime of the memory.

Embodiments of the present disclosure, however, can compensate for threshold voltage drift that may occur in the memory cells of a codeword, such that the data states of the memory cells of the codeword can be accurately determined. For example, embodiments of the present disclosure can use a Pearson detector to determine the originally programmed data of a codeword whose memory cells have been affected by threshold voltage drift. Accordingly, embodiments of the present disclosure can increase the performance and/or lifetime of memory that utilizes codewords (e.g., by estimating the original value of the data bits in a codeword that has been affected by threshold voltage drift).

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designator "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figures 1A, 1B:
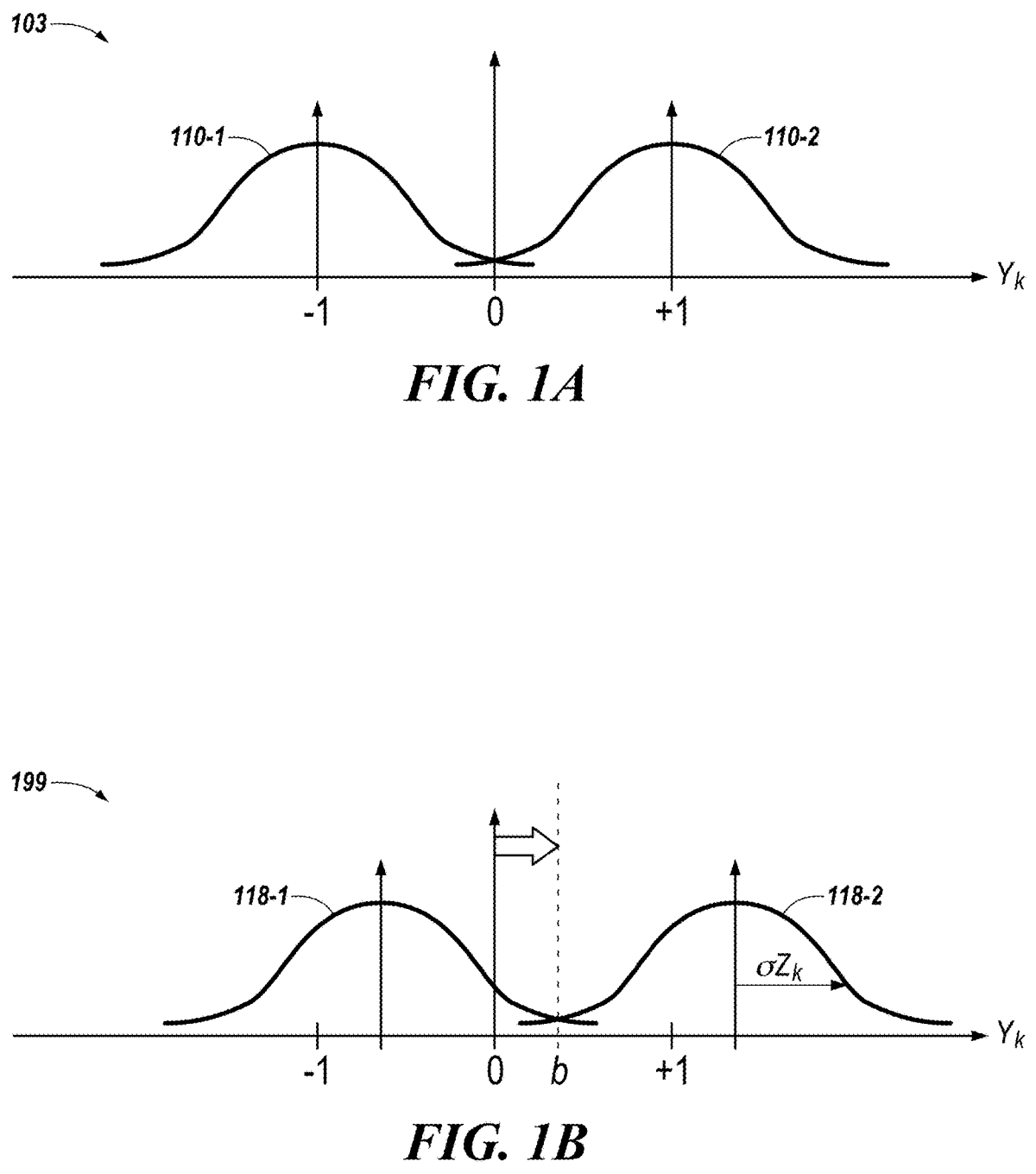

FIGS. 1A and 1B illustrate diagrams of a number of threshold voltage (Vt) distributions, sensing voltages, and data assignments associated with a group of memory cells in accordance with an embodiment of the present disclosure. The group of memory cells can be, for example, a codeword, which can refer to a logical unit of a memory device used to store data. FIG. 1A illustrates a diagram 103 of Vt distributions 110-1 and 110-2 associated with the data states of the memory cells of a codeword before the memory cells of the codeword have experienced threshold voltage drift, and FIG. 1B illustrates a diagram 199 of Vt distributions 118-1 and 118-2 associated with codeword after the memory cells of the codeword have experienced threshold voltage drift.

As an example, the two Vt distributions 110-1 and 110-2 shown in FIG. 1A, and the two Vt distributions 118-1 and 118-2 shown in FIG. 1B, can correspond to single level (e.g., two-state) memory cells. However, embodiments of the present disclosure are not limited to single level memory cells. For example, embodiments of the present disclosure can include multilevel cells such as, for instance, triple level cells (TLCs), or quadruple level cells (QLCs). In such examples, the diagrams illustrated in FIGS. 1A and 1B would include additional Vt distributions (e.g., corresponding to each of the additional data states).

Vt distributions 110-1 and 110-2 shown in FIG. 1A, and Vt distributions 118-1 and 118-2 shown in FIG. 1B, represent two target data states (e.g., 1 and 0, respectively, which are represented in FIGS. 1A and 1B by −1 and 1, respectively) to which the memory cells of the group can be programmed. Embodiments of the present disclosure, however, are not limited to these data assignments.

Vt distributions 110-1 and 110-2 shown in FIG. 1A, and Vt distributions 118-1 and 118-2 shown in FIG. 1B, can represent a quantity (e.g., number) of memory cells of the group that are programmed to the corresponding target states (e.g., 1 and 0), with the height of a Vt distribution curve indicating the quantity of cells programmed to a particular voltage within the Vt distribution (e.g., on average). The width of the Vt distribution curve indicates the range of voltages that represent a particular target state (e.g., the width of the Vt distribution curves 110-2 and 118-2 represent the range of voltages that correspond to a data value of 0 for the original codeword (e.g. before the codeword has experienced threshold voltage drift) and the codeword after it has experienced threshold voltage drift, respectively). In the example illustrated in FIG. 1A (e.g., the original codeword), the widths and heights of Vt distributions 110-1 and 110-2 are equivalent (e.g., equal). Further, in the example illustrated in FIG. 1B (e.g., the codeword that has experienced drift), the widths and heights of Vt distributions 118-1 and 118-2 are equivalent.

During a sense (e.g., read) operation to determine the respective data states stored by the memory cells of the group, a reference voltage located between the two Vt distributions (e.g., at location 0 illustrated in FIG. 1A) can be used to distinguish between the two data states (e.g., between states 1 and 0). For example, during a sense operation performed on a selected memory cell of the group, a sense voltage can be applied to first signal line (e.g., an access line) to which the memory cell is coupled, and the resulting voltage signal (e.g. in response to the sense voltage being applied to the access line) from the memory cell can be provided to sense circuitry via a second signal line (e.g., a sense line) to which the memory cell is coupled for comparison with the reference voltage. The data state for the selected memory cell can be determined using (e.g., by comparing) the voltage signal from that memory cell and the reference voltage.

In the examples illustrated in FIGS. 1A and 1B, the reference voltage used to distinguish between the two data states can be determined by averaging the threshold voltages of the memory cells of the group (e.g., codeword). For the original codeword (e.g., whose cells have not experienced threshold voltage drift), this reference voltage would be located exactly between its Vt distributions 110-1 and 110-2 at 0, as illustrated in FIG. 1A. However, for the codeword whose memory cells have experienced drift, this reference voltage would be located exactly between its Vt distributions 118-1 and 118-2 at b instead of 0, which is illustrated in FIG. 1B. As such, using 0 as the reference voltage to sense the data states of the memory cells of the codeword that has experienced drift may result in some cells of that codeword being sensed to be in a state to which they were not actually programmed to. For instance, a cell programmed to a target state of 1, but whose voltage is to the right of 0 (e.g., the reference voltage in FIG. 1A) within distribution 118-1, may be erroneously sensed to be in state 0.

Embodiments of the present disclosure, however, can compensate for this threshold voltage drift by determining (e.g., estimating) the original (e.g., expected) data bits of a codeword that has experienced threshold voltage drift. Estimating the originally programmed data of the codeword can reduce the likelihood of the data states of the memory cells in the codeword being read incorrectly when the memory cells have experienced threshold voltage drift.

FIG. 2 is a block diagram illustration of an example apparatus, such as an electronic memory system 200, in accordance with an embodiment of the present disclosure. Memory system 200 may include an apparatus, such as a memory device 202 and a controller 204, such as a memory controller (e.g., a host controller). Controller 204 might include a processor, for example. Controller 204 might be coupled to a host, for example, and may receive command signals (or commands), address signals (or addresses), and data signals (or data) from the host and may output data to the host.

Memory device 202 includes a memory array 201 of memory cells. For example, memory array 201 can include a group of memory cells, such as a codeword, as previously described herein (e.g., in connection with FIGS. 1A-1B). Memory array 201 can be, for example, a DRAM array, such as, for instance, a ferroelectric memory (e.g., FeRAM) array. That is, the memory cells of array 201 can be DRAM (e.g., FeRAM) cells. However, embodiments are not limited to a particular type of memory array. For instance, in some embodiments (e.g., embodiments in which non-destructive read operations are performed on the memory cells of array 201), memory array 201 can be a NAND flash array (e.g., the memory cells of array 201 can be NAND flash memory cells). As an additional example, in some embodiments (e.g., embodiments in which destructive read operations are performed on the memory cells of array 201), memory array 201 can be a self-selecting memory array (e.g., the memory cells of array 201 can comprise a single material that serves as both a select element and a storage element). Further, although one memory array 201 is illustrated in FIG. 2 for simplicity and so as not to obscure embodiments of the present disclosure, memory device 202 can include a number of memory arrays analogous to array 201.

Memory device 202 may include address circuitry 208 to latch address signals provided over I/O connections 211 through I/O circuitry 212. Address signals may be received and decoded by a row decoder 214 and a column decoder 216 to access the memory array 201. For example, row decoder 214 and/or column decoder 216 may include drivers.

Controller 204 may sense (e.g., read) data in memory array 201, such as a codeword stored in array 201, by using read/latch circuitry 221 and/or sensing circuitry 205. Read/latch circuitry 221 may read and latch data from the memory array 201. Sensing circuitry 205 may include a number of sense amplifiers coupled to memory cells of memory array 201, which may operate in combination with the read/latch circuitry 221 to sense (e.g., read) memory states from targeted memory cells. I/O circuitry 212 may be included for bi-directional data communication over the I/O connections 211 with controller 204. Write circuitry 222 may be included to program (e.g., write) data to memory array 201.

Control circuitry 224 may decode signals provided by control connections 226 from controller 204. These signals may include chip signals, write enable signals, and address latch signals that are used to control the operations on memory array 201, including data read and data write operations. Control circuitry 224 may be included in controller 204, for example. Controller 204 may include other circuitry, firmware, software, or the like, whether alone or in combination. Controller 204 may be an external controller (e.g., in a separate die from the memory array 201, whether wholly or in part) or an internal controller (e.g., included in a same die as the memory array 201). For example, an internal controller might be a state machine or a memory sequencer.

The memory device 202 can also include circuitry configured to determine (e.g., estimate) the originally programmed data of a codeword (e.g., a sensed codeword) that has experienced threshold voltage drift. For example, the memory device 202 can include sorting circuitry 207, weight bending circuitry 209, and a Pearson detector 206. The sorting circuitry 207 can sort the data bits (e.g., the threshold voltage values of the memory cells) of the codeword into different voltage distributions, the weight bending circuitry 209 can perform weight bending and de-bending operations on the codeword, and Pearson detector 206 can determine the originally programmed data of the codeword (e.g., the value of the data bits in the originally programmed codeword). In some embodiments, the sorting circuitry 207, weight bending circuitry 209, and Pearson detector 206 can be included in (e.g., located on) a controller (e.g., controller 204) instead of the memory device 202.

Determining the originally programmed data of a codeword includes inputting a cell metric whose second derivative value is determined to have the greatest (e.g., maximum) value relative to the value of the second derivative of other cell metrics into the Pearson detector 206. For instance, the second derivative value of the cell metric for a number of the memory cells of the codeword can be determined, and the cell metric for which the determined second derivative value has the greatest (e.g., maximum) value can be input to the Pearson detector 206 to determine the originally programmed data of the codeword. As used herein, the term "cell metric" refers to a value associated with a memory cell that can be input into a Pearson detector. An example of the second derivative values of the cell metrics will be further described herein (e.g., in connection with FIG. 3).

In some embodiments, the cell metric input to the Pearson detector 206 can comprise a Pearson distance between the second derivative value of the determined cell metric and a correlation between the originally programmed data of the codeword and the sensed codeword. For instance, the value of the cell metric for which the second derivative value is greatest and a correlation between a tentative codeword and the sensed codeword can be input into the Pearson detector to determine the originally programmed data of the codeword. As used herein, the term "tentative codeword" refers to a codeword that provides the lowest Pearson distance between the sensed codeword and the originally programmed codeword relative to the other codewords in the memory array 201. The sensed codeword can comprise a sensed data value for each memory cell of the sensed codeword. The originally programmed data of the codeword can include the programmed data value for each memory cell of the codeword (e.g., corresponding to the data bits in the originally programmed codeword).

The Pearson detector 206 can determine the originally programmed data of the codeword by searching for a codeword (e.g., a sensed codeword) that has a lowest Pearson distance from the original codeword relative to other codewords (e.g., other sensed codewords). As used herein, the term "Pearson distance" refers to a measure of the linear correlation between two sets of data (e.g. between two codewords). The Pearson detector can use the sensed codeword that has the lowest Pearson distance from the original codeword to estimate the value of each data bit of the original codeword. In some embodiments, the Pearson detector can determine the lowest Pearson distance using a weight estimator. The weight estimator can be the estimated weight of the original codeword. As used herein, the term "weight" refers to the number of data bits with a particular data value (e.g., the number bits with a value of 1) in a codeword.

The second derivative value of the cell metric for each respective one of the number of memory cells of the codeword can be determined based on the threshold voltage value of that memory cell, the threshold voltage value immediately preceding the threshold voltage value of that respective memory cell in the sorted threshold voltage values (e.g., the threshold voltage value whose position in the sorted threshold voltage values immediately precedes the position of the threshold voltage value of that respective memory cell), and a value proportional to the total quantity of memory cells of the codeword. For example, the second derivative value of the cell metric for each respective one of the number of memory cells (e.g., each respective data bit) of the sensed codeword can be given by the following equation:

$$J_w = Y_w - Y_{w-1} - (2/N)$$

In the foregoing equation, the second derivative value of the cell metric for each respective one of the number of memory cells is represented by the symbol $J_w$. The equation states that the second derivative value of the cell metric for a memory cell can be determined by subtracting the threshold voltage value immediately preceding the threshold voltage value of that memory cell in the sorted threshold voltage values, represented in the foregoing equation as $Y_{w-1}$, and the value given by 2/N, where N is the total quantity of memory cells of the codeword, from the threshold voltage value of that memory cell, represented in the foregoing equation as $Y_w$. That is, the value proportional to the total quantity of memory cells of the codeword can be inversely proportional to the total quantity of memory cells of the codeword (e.g., given by 2/N). Further, the second derivative value of the cell metric for each respective one of the number of memory cells of the sensed codeword can correspond to the difference between the first derivative value of the cell metric for that memory cell and the first derivative value of the cell metric for the memory cell whose threshold voltage value's position immediately precedes the position of the threshold voltage value of that memory cell in the sorted threshold voltage value sequence. An example illustrating the second derivative values of the cell metrics will be further described herein (e.g., in connection with FIG. 3). Further, the process for sorting the threshold voltage values of the memory cells of the sensed codeword in ascending order (e.g., based on the threshold voltage value of the corresponding memory cell) is described in connection with FIG. 4.

It is noted that the second derivative value of the cell metric for each respective one of the number of memory cells, and therefore the originally programmed data of the codeword, can be determined without determining the mean of the threshold voltage values of the codeword. By determining the originally programmed data of the codeword without determining the mean of the threshold voltage values, embodiments of the present disclosure can reduce the amount of circuitry and/or the complexity of the operations used to determine the originally programmed data of the codeword. Further, by determining the originally programmed data of the codeword without determining the mean of the threshold voltage values, embodiments of the present disclosure can include embodiments in which the memory cells of memory array 201 are sensed via destructive sense operations (e.g., embodiments in which memory array 201 is a self-selecting array).

The number of memory cells of the codeword for which the second derivative value of the cell metric is determined can be less than all (e.g., only a portion) of the cells of the codeword. For example, the number of memory cells of the codeword for which the second derivative value of the cell metric is determined can comprise only the memory cells of the codeword having threshold voltage values whose positions in the sorted threshold voltage values are within a particular position range in the sorted threshold voltage values. The particular position range can comprise the positions between a minimum position and a maximum position in the sorted threshold voltage values. The minimum position can correspond to a minimum weight of the codeword (e.g., a minimum quantity of data bits in the codeword with a particular data value), and the maximum position can correspond to the difference between the total quantity of memory cells of the codeword and the minimum position. An example illustrating such a position range will be further described herein (e.g., in connection with FIG. 3).

The number of memory cells of the codeword for which the second derivative value of the cell metric is determined (e.g., the particular position range in the sorted threshold voltage values) can be determined using weight bending circuitry 209. For example, weight bending circuitry 209 can perform a weight bending operation on the on the sensed codeword to determine the number of memory cells of the codeword for which to determine the second derivative value of the cell metric. The weight bending operation can include, for instance, dividing the sensed codeword into a plurality of segments, changing (e.g., flipping) the data value of a number of the data bits of each segment from a first data value to a second data value, and adding a number of additional data bits to each segment for encoding the data of the codeword. As an example, the sensed codeword can be divided into four segments, two data bits of each segment can be flipped, and two additional data bits can be added to each segment. However, embodiments are not limited to this example. After it has been determined which cell metric has the greatest second derivative value, weight bending circuitry 209 can perform a weight de-bending operation on the sensed codeword to undo the weight bending operation and decode the data of the sensed codeword.

The number of data bits in the codeword having a value of 0 can be different than the number of data bits in that same codeword that have a value of 1. In some embodiments, a data bit that has a first value can be added to the codeword if the sensed codeword only comprises data bits having a second value. For example, if the codeword only comprises data bits having a value of 1, a data bit with a value of 0 can be added to the codeword. Alternatively, if the codeword only comprises data bits having a value of 0, a data bit with a value of 1 can be added to the codeword.

Figure 3:
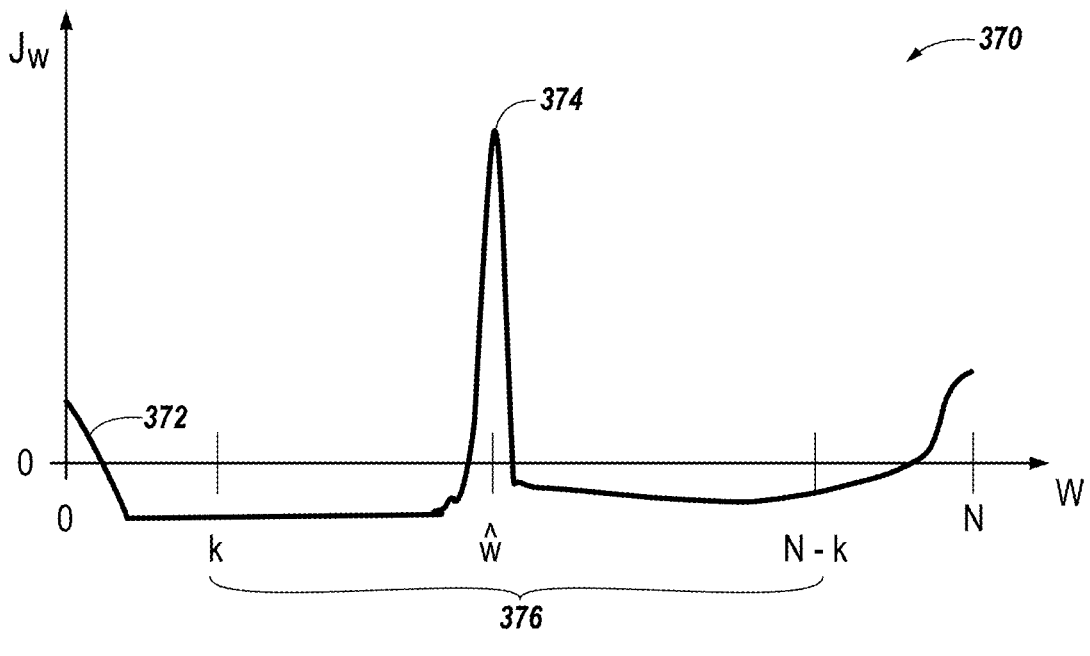
FIG. 3 is a diagram illustrating a conceptual example of second derivative values of cell metrics in accordance with an embodiment of the present disclosure.

FIG. 3 is a diagram 370 illustrating a conceptual example of second derivative values of cell metrics in accordance with an embodiment of the present disclosure. For instance, curve 372 illustrated in FIG. 3 represents the second derivative values ($J_w$) of the cell metrics for the memory cells of a codeword after the threshold voltage values of the memory cells have been sorted and ordered in their respective positions (w) in the sorted threshold voltage value sequence. The second derivative value of the cell metric for each respective one of the number of memory cells of the sensed codeword can correspond to the difference between the first derivative value of the cell metric for that memory cell and the first derivative value of the cell metric for the memory cell whose threshold voltage value's position immediately precedes the position of the threshold voltage value of that memory cell in the sorted threshold voltage value sequence, as previously described herein.

In the example shown in FIG. 3, the cell metric for the memory cell of the codeword whose threshold voltage value is in the ŵth position in the sorted threshold voltage value sequence has the greatest (e.g., maximum) second derivative value 374. Accordingly, the cell metric for this memory cell would be the cell metric input to Pearson detector 206 of FIG. 2 to determine the originally programmed data of the codeword, as previously described herein.

Further, in the example shown in FIG. 3, only the memory cells of the codeword having threshold voltage values whose positions (w) are within range (e.g., window) 376 may have their second derivative values determined (e.g., the memory cells of the codeword having threshold voltage values whose positions are outside range 376 would not have their second derivative values determined). As shown in FIG. 3, position range 376 includes the (e.g., all) positions in the sorted threshold voltage value sequence between position k and position N-k (e.g., position k is the minimum position of range 376, and position N-k is the maximum position of range 376). The memory cells of the codeword having threshold voltage values between the first (e.g., $0^{th}$) position and position k in the sorted threshold voltage value sequence, and between position k and the last (e.g., Nth) position in the sorted threshold voltage value sequence, would not have their second derivative values determined, as these positions may constitute noise.

Position k can be a design parameter, and can correspond to (e.g., be defined in accordance with) the minimum weight of the codeword, and position N-k can correspond to the difference between the total quantity of memory cells of the codeword (N) and position k. As an example, position k can be selected such that it corresponds to the position at the $25^{th}$ percentile of the sorted threshold voltage values and position N-k corresponds to the position at the $75^{th}$ percentile of the sorted threshold voltage values (e.g., such that range 376 comprises the positions between the $25^{th}$ percentile and the $75^{th}$ percentile of the sorted threshold voltage values). However, embodiments of the present disclosure are not limited to this example.

Figure 4:
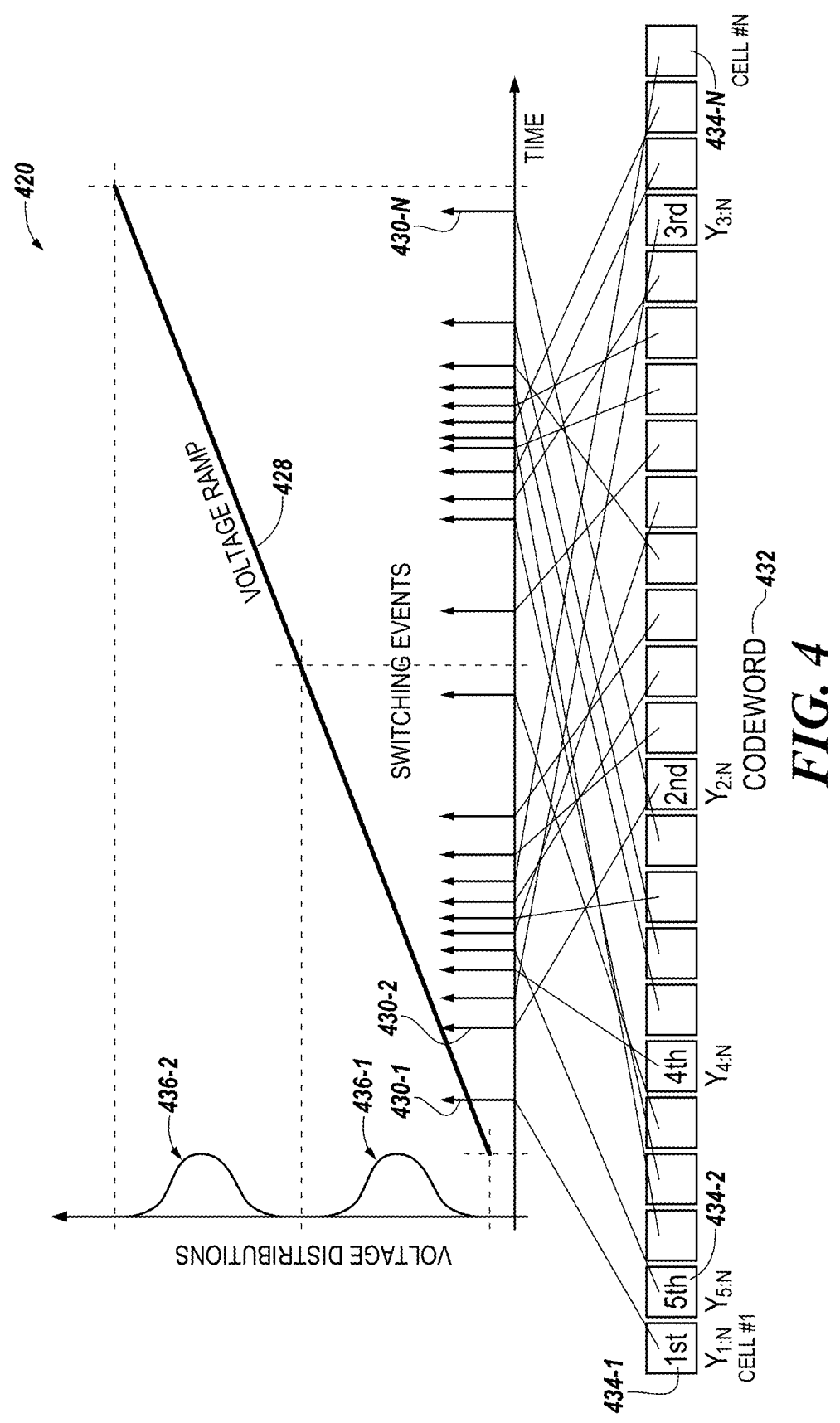
FIG. 4 is a diagram illustrating voltage distributions and corresponding data bits in a codeword in accordance with an embodiment of the present disclosure.

FIG. 4 is a diagram illustrating voltage distributions and corresponding data bits in a codeword in accordance with an embodiment of the present disclosure. FIG. 4 illustrates a diagram 420 including a ramp voltage 428, switching event times 430-1, 430-2, . . . , 430-N (individually or collectively referred to as switching event times 430) of data bits 434-1, 434-2, . . . , 434-N (individually or collectively referred to as data bits 434) in a codeword 432. The diagram 420 also includes voltage distributions 436-1 and 436-2.

Diagram 420 includes switching event times 430 for data bits 434 of a codeword 432 (e.g., switching event time 430-1 for data bit 434-1, switching event time 430-2 for data bit 434-2, etc.). As used herein, the term "switching event" refers to an occurrence of a memory cell changing from a low conductive state to a high conductive state, or a high conductive state to a low conductive state, in response to receiving a current that has a voltage that is greater than or equal to the threshold voltage of the memory cell. In some embodiments, applying the ramped up voltage 428 (e.g., a voltage that increases with time) to each of the memory cells can initiate a switching event in each of the memory cells at different times. For instance, in the example illustrated in FIG. 4, the memory cell of the codeword corresponding to data bit 434-1 (e.g., $Y_{1:N}$) is the first cell to switch (at switching event time 430-1), the memory cell of the codeword corresponding to data bit $Y_{2:N}$ is the second cell to switch (at switching event time 430-2), and the memory cell of the codeword corresponding to data bit 434-2 is the fifth cell to switch. The threshold voltage value of each of the memory cells can be determined after the switching event occurs in that respective memory cell.

In some embodiments, circuitry (e.g., sorting circuitry 207 in FIG. 2) can sort the threshold voltage values of each of the memory cells in ascending order (e.g., from lowest to highest). Further, the sorted threshold voltage values can be divided into a first distribution 436-1 and second distribution 436-2, with the first distribution including the lower threshold voltage values (e.g., the cells of the codeword with the shorter switching times) and the second distribution including the higher threshold voltage values (e.g., the cells of the codeword with the longer switching times). In some embodiments, the sorted threshold voltages are divided into the first distribution 436-1 and the second distribution 436-2 such that the quantity of threshold voltage values in the first distribution 436-1 is equal to an estimated weight of the codeword 432. Further, the sorted threshold voltage values can be divided into the first distribution 436-1 and the second distribution 436-2 such that the quantity of the threshold voltage values in the second distribution 436-2 is equal to a difference between the quantity of memory cells in the codeword 432 and the quantity of the threshold voltage values in the first distribution 436-1.

First distribution 436-1 can correspond to a first data state, and second distribution 436-2 can correspond to a second data state. As an example, first distribution 436-1 can correspond to a data state of 1, and second distribution 436-2 can correspond to a data state of 0.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device, wherein the memory device includes:
   an array of memory cells; and
   circuitry configured to:
      sense a codeword stored in the array of memory cells;
      determine a second derivative value of a cell metric for a number of memory cells of the sensed codeword;
      determine the cell metric for which the determined second derivative value has a greatest value; and
      determine originally programmed data of the codeword using the determined cell metric.

2. The apparatus of claim 1, wherein the circuitry is configured to determine the originally programmed data of the codeword by inputting the determined cell metric to a Pearson detector.

3. The apparatus of claim 1, wherein the circuitry is configured to determine the second derivative value of the cell metric for each respective one of the number of memory cells of the sensed codeword based on a threshold voltage value of that respective memory cell.

4. The apparatus of claim 1, wherein the circuitry is configured to determine the second derivative value of the cell metric for each respective one of the number of memory cells of the sensed codeword based on a value proportional to a total quantity of memory cells of the codeword.

5. The apparatus of claim 4, wherein the value is inversely proportional to the total quantity of memory cells of the codeword.

6. The apparatus of claim 1, wherein the determined cell metric comprises a Pearson distance.

7. The apparatus of claim 1, wherein the sensed codeword comprises a sensed data value for each memory cell of the codeword.

8. The apparatus of claim 1, wherein the originally programmed data of the codeword comprises a programmed data value for each memory cell of the codeword.

9. A method, comprising:
sensing a codeword stored in an array of memory cells of a memory device;
determining a second derivative value of a cell metric for a number of memory cells of the sensed codeword;
determining the cell metric for which the determined second derivative value has a greatest value; and
determining originally programmed data of the codeword using the determined cell metric.

10. The method of claim 9, wherein the method includes:
determining a threshold voltage value of each memory cell of the sensed codeword; and
sorting the threshold voltage values of the memory cells of the sensed codeword.

11. The method of claim 10, wherein the second derivative value of the cell metric for each respective one of the number of memory cells is determined based on:

the threshold voltage value of that respective memory cell; and
the threshold voltage value immediately preceding the threshold voltage value of that respective memory cell in the sorted threshold voltage values.

12. The method of claim 10, wherein the second derivative value of the cell metric for each respective one of the number of memory cells corresponds to a difference between a first derivative value of the cell metric for that respective memory cell and a first derivative value of the cell metric for the memory cell having the threshold voltage value immediately preceding the threshold voltage value of that respective memory cell in the sorted threshold voltage values.

13. The method of claim 10, wherein the method includes:
initiating a switching event in each respective memory cell of the sensed codeword; and
determining the threshold voltage value of each respective memory cell of the sensed codeword after the switching event occurs in that respective memory cell.

14. The method of claim 10, wherein the method includes determining the second derivative value of the cell metric for the number of memory cells of the sensed codeword without determining a mean of the threshold voltage values of the memory cells of the sensed codeword.

15. The method of claim 10, wherein the method includes sorting the threshold voltage values of the memory cells of the sensed codeword in ascending order.

16. The method of claim 9, wherein the number of memory cells of the sensed codeword for which the second derivative value of the cell metric is determined comprises less than all of the memory cells of the sensed codeword.

17. An apparatus, comprising:
a memory device, wherein the memory device includes:
   an array of memory cells;
   circuitry configured to:
      sense a codeword stored in the array of memory cells;
      determine a second derivative value of a cell metric for a number of memory cells of the sensed codeword; and
      determine the cell metric for which the determined second derivative value has a greatest value; and
   a Pearson detector configured to determine originally programmed data of the codeword using the determined cell metric.

18. The apparatus of claim 17, wherein the number of memory cells of the sensed codeword for which the second derivative value of the cell metric is determined comprises the memory cells of the sensed codeword having threshold voltage values within a particular range.

19. The apparatus of claim 17, wherein the array of memory cells comprises an array of self-selecting memory cells.

20. The apparatus of claim 17, wherein the Pearson detector is configured to determine the originally programmed data of the codeword by searching for a codeword.

* * * * *